(12) United States Patent
Kashima et al.

(10) Patent No.: US 10,550,228 B2
(45) Date of Patent: *Feb. 4, 2020

(54) RESIN COMPOSITION, PREPREG, METAL FOIL-CLAD LAMINATE, AND PRINTED CIRCUIT BOARD

(71) Applicant: MITSUBISHI GAS CHEMICAL COMPANY, INC., Tokyo (JP)

(72) Inventors: Naoki Kashima, Tokyo (JP); Katsuya Tomizawa, Tokyo (JP); Meguru Ito, Tokyo (JP); Tomoki Hamajima, Tokyo (JP); Eisuke Shiga, Tokyo (JP); Kentaro Takano, Tokyo (JP); Shota Koga, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/737,490

(22) PCT Filed: Jul. 4, 2016

(86) PCT No.: PCT/JP2016/069744
§ 371 (c)(1),
(2) Date: Dec. 18, 2017

(87) PCT Pub. No.: WO2017/006891
PCT Pub. Date: Jan. 12, 2017

(65) Prior Publication Data
US 2018/0186933 A1 Jul. 5, 2018

(30) Foreign Application Priority Data

Jul. 6, 2015 (JP) ................................ 2015-135209
May 2, 2016 (JP) ................................ 2016-092761

(51) Int. Cl.
| | | |
|---|---|---|
| *C08G 73/06* | (2006.01) |
| *C08J 5/24* | (2006.01) |
| *C08G 59/62* | (2006.01) |
| *C08K 3/22* | (2006.01) |
| *C08K 3/36* | (2006.01) |
| *B32B 15/088* | (2006.01) |
| *C08F 226/06* | (2006.01) |
| *C08G 59/40* | (2006.01) |
| *H01B 3/30* | (2006.01) |
| *H05K 1/03* | (2006.01) |

(52) U.S. Cl.
CPC ........ *C08G 73/0611* (2013.01); *B32B 15/088* (2013.01); *C08F 226/06* (2013.01); *C08G 59/4014* (2013.01); *C08G 59/62* (2013.01); *C08G 73/0672* (2013.01); *C08J 5/24* (2013.01); *C08K 3/22* (2013.01); *C08K 3/36* (2013.01); *H01B 3/306* (2013.01); *H05K 1/0373* (2013.01); *C08J 2339/04* (2013.01); *C08K 2003/2227* (2013.01); *H05K 2201/0355* (2013.01)

(58) Field of Classification Search
CPC ............ C08G 73/0611; C08G 59/4014; C08G 59/62; C08G 73/06; C08G 73/0672; B32B 15/08; B32B 15/088; C08F 222/40; C08F 226/06; C08J 5/24; C08J 2339/04; C08K 3/22; C08K 3/36; C08K 2003/2227; H01B 3/306; H05K 1/0373; H05K 2201/0355
USPC ........................................................ 523/438
See application file for complete search history.

(56) References Cited

U.S. PATENT DOCUMENTS

| | | | |
|---|---|---|---|
| 4,581,425 A * | 4/1986 | Hefner, Jr. ............ C08F 212/14 428/423.1 |
| 4,861,823 A | 8/1989 | Qureshi |
| 2009/0017316 A1 | 1/2009 | Kato et al. |
| 2011/0187009 A1 | 8/2011 | Masuko et al. |
| 2011/0194261 A1 | 8/2011 | Tanaka et al. |
| 2013/0122768 A1 | 5/2013 | Harada et al. |
| 2016/0125971 A1 | 5/2016 | Hasebe et al. |

FOREIGN PATENT DOCUMENTS

| | | |
|---|---|---|
| CN | 102112568 A | 6/2011 |
| CN | 103025775 A | 4/2013 |
| JP | 2-92910 A | 4/1990 |
| JP | 10-292033 A | 11/1998 |
| JP | 3173332 B2 | 3/2001 |
| JP | 2004-224817 A | 8/2004 |
| JP | 2009-19171 A | 1/2009 |
| JP | 2009-35728 A | 2/2009 |
| JP | 2011-178992 A | 9/2011 |
| JP | 2012-197336 A | 10/2012 |
| JP | 2013-1807 A | 1/2013 |
| JP | 2013-127022 A | 6/2013 |
| JP | 2013-216884 A | 10/2013 |
| TW | 201504039 A | 2/2015 |
| WO | 2010/016305 A1 | 2/2010 |

OTHER PUBLICATIONS

ISR of PCT/JP2016/069744, dated Aug. 16, 2016.
IPRP of PCT/JP2016/069744, dated Jan. 9, 2018.
Database WPI, Week 201158, 2011, 2011-J98236, XP002787870, & CN 102 115 600 A (Suzhou Shengyi Sci & Technology Ltd) Jul. 6, 2011 (Jul. 6, 2011).

* cited by examiner

Primary Examiner — David T Karst
(74) Attorney, Agent, or Firm — Greenblum & Bernstein, P.L.C.

(57) ABSTRACT

The present invention provides a resin composition containing an allyl group-containing compound (A) and a maleimide compound (B), in which the allyl group-containing compound (A) has a reactive functional group other than an allyl group.

25 Claims, No Drawings

RESIN COMPOSITION, PREPREG, METAL FOIL-CLAD LAMINATE, AND PRINTED CIRCUIT BOARD

TECHNICAL FIELD

The present invention relates to a resin composition, a prepreg, a metal foil-clad laminate, and a printed circuit board.

BACKGROUND ART

In accordance with functionality increase and downsizing of semiconductor packages widely used in electronic devices, communication devices, personal computers and the like, high integration and high-density packaging of each component for semiconductor packages have been increasingly accelerated in recent years. As a result, a difference in the coefficient of thermal expansion between a semiconductor device and a printed circuit board for a semiconductor plastic package disadvantageously causes warp of the semiconductor plastic package, and there have been various countermeasures against this problem.

One of the countermeasures is reduction of the thermal expansion of an insulating layer for use in a printed circuit board. In this countermeasure, the warp is suppressed by setting the coefficient of thermal expansion of a printed circuit board to be close to the coefficient of thermal expansion of a semiconductor device, and this method is now actively employed (see, for example, Patent Literatures 1 to 3).

In addition to the reduction of the thermal expansion of a printed circuit board, as a method for suppressing the warp of a semiconductor plastic package, increase of rigidity (rigidity increase) of a laminate and increase of a glass transition temperature (Tg increase) of a laminate are now being examined (see, for example, Patent Literatures 4 and 5).

CITATION LIST

Patent Literature

Patent Literature 1: Japanese Patent Laid-Open No. 2013-216884
Patent Literature 2: Japanese Patent No. 3173332
Patent Literature 3: Japanese Patent Laid-Open No. 2009-035728
Patent Literature 4: Japanese Patent Laid-Open No. 2013-001807
Patent Literature 5: Japanese Patent Laid-Open No. 2011-178992

SUMMARY OF INVENTION

Technical Problem

The reduction of the thermal expansion of a printed circuit board by the conventional methods described in Patent Literatures 1 to 3 have, however, already reached their limits, and it is difficult to further reduce the thermal expansion by these methods.

The rigidity increase of a laminate is attained by highly incorporating a filler in a resin composition to be used for the laminate, or by using an inorganic filler having a high elastic modulus such as alumina. However, the high incorporation of a filler degrades moldability of the laminate, and the use of an inorganic filler such as alumina degrades the coefficient of thermal expansion of the laminate. Accordingly, the warp of a semiconductor plastic package cannot be sufficiently suppressed by the rigidity increase of a laminate.

Besides, the method by the Tg increase of a laminate improves an elastic modulus in reflow, and hence is effective for reduction of the warp of a semiconductor plastic package. The method by the Tg increase causes, however, degradation of heat resistance after moisture absorption due to increased crosslink density or occurrence of a void resulting from the moldability degradation, and therefore, this method occasionally causes a practical problem in the field of electronic materials where very high reliability is required. Accordingly, there is a demand for a method for solving these problems.

Furthermore, an insulating layer of a printed circuit board is required to simultaneously have high elastic modulus retention, heat resistance after moisture absorption, high copper foil peel strength, desmear resistance, and excellent chemical resistance. There has not been, however, reported a resin composition capable of providing a cured product satisfying all of these requirements.

The present invention was accomplished in consideration of the above-described problems. Specifically, one object of the present invention is to provide a resin composition providing a cured product, which is excellent in flexural strength and flexural modulus, has a low dielectric constant and a high glass transition temperature (high Tg), has a low coefficient of thermal expansion and has excellent thermal conductivity, and a prepreg, a metal foil-clad laminate and a printed circuit board all using the resin composition. Another object of the present invention is to provide a resin composition providing a cured product, which is excellent in a low coefficient of thermal expansion, a high Tg and high copper foil peel strength, and which is excellent also in elastic modulus retention, heat resistance after moisture absorption, desmear resistance and chemical resistance, and a prepreg, a metal foil-clad laminate and a printed circuit board all using the resin composition.

Solution to Problem

The present inventors made earnest studies to solve the above-described problems. As a result, it was found that the above-described problems can be solved by causing an allyl group-containing compound (A) to be contained, and thus, the present invention was accomplished.

Specifically, the present invention provides:

[1]
A resin composition comprising:
an allyl group-containing compound (A); and
a maleimide compound (B),
wherein the allyl group-containing compound (A) has a reactive functional group other than the allyl group.

[2]
The resin composition according to [1],
wherein the reactive functional group comprises at least one selected from the group consisting of a cyanate group, a hydroxyl group and an epoxy group.

[3]
The resin composition according to [1] or [2],
wherein the reactive functional group comprises a cyanate group.

[4]
The resin composition according to any one of [1] to [3],
wherein the allyl group-containing compound (A) comprises an allyl group-containing compound having a cyanate group as the reactive functional group, and an allyl group-containing compound having an epoxy group as the reactive functional group.

[5]
The resin composition according to any one of [1] to [4], wherein the allyl group-containing compound (A) comprises a compound represented by the following formula (7-1):

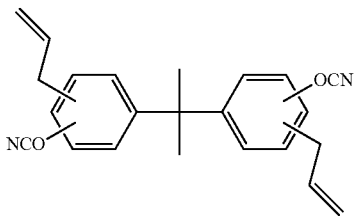

[6]
The resin composition according to any one of [1] to [5], wherein the allyl group-containing compound (A) comprises a compound represented by the following formula (7-2):

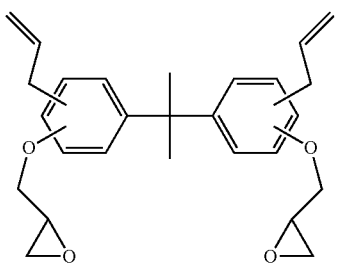

[7]
The resin composition according to any one of [1] to [6], wherein a content of the allyl group-containing compound (A) is 1 to 90 parts by mass based on 100 parts by mass of a resin solid content.

[8]
The resin composition according to any one of [1] to [7], further comprising a filler (C).

[9]
The resin composition according to [8], wherein a content of the filler (C) is 50 to 1600 parts by mass based on 100 parts by mass of a resin solid content.

[10]
The resin composition according to [8] or [9], wherein the filler (C) comprises at least one selected from the group consisting of silica, alumina, magnesium oxide, aluminum hydroxide, boehmite, boron nitride, agglomerated boron nitride, silicon nitride and aluminum nitride.

[11]
The resin composition according to any one of [8] to [10], wherein the filler (C) is one, two or more selected from the group consisting of alumina, boron nitride, agglomerated boron nitride, silicon nitride, and aluminum nitride.

[12]
The resin composition according to any one of [1] to [11], further comprising one, two or more selected from the group consisting of an allyl group-containing compound different from the allyl group-containing compound (A), a cyanate ester compound, an epoxy resin, a phenol resin, an oxetane resin, a benzoxazine compound, and a compound having a polymerizable unsaturated group.

[13]
A resin composition comprising:
an allyl group-containing compound (A);
a maleimide compound (B); and
an alkenyl-substituted nadimide compound (D),
wherein the allyl group-containing compound (A) has a reactive functional group other than the allyl group.

[14]
The resin composition according to [13], further comprising an epoxy resin.

[15]
The resin composition according to [13] or [14], wherein the reactive functional group comprises at least one selected from the group consisting of a cyanate group, a hydroxyl group and an epoxy group.

[16]
The resin composition according to any one of [13] to [15], wherein the reactive functional group comprises a cyanate group.

[17]
The resin composition according to any one of [13] to [16], wherein the alkenyl-substituted nadimide compound (D) comprises a compound represented by the following formula (1):

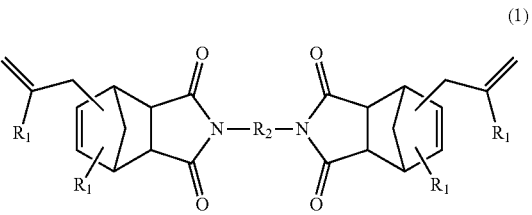

wherein each $R_1$ independently represents a hydrogen atom or an alkyl group having 1 to 6 carbon atoms, $R_2$ represents an alkylene group having 1 to 6 carbon atoms, a phenylene group, a biphenylene group, a naphthylene group, or a group represented by the following formula (2) or (3):

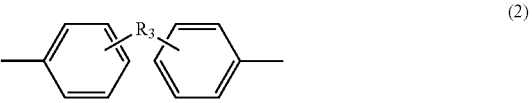

wherein $R_3$ represents a methylene group, an isopropylidene group, or a substituent represented by CO, O, S or $SO_2$; and

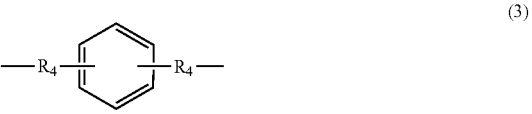

wherein each $R_4$ independently represents an alkylene group having 1 to 4 carbon atoms, or a cycloalkylene group having 5 to 8 carbon atoms.

[18]

The resin composition according to any one of [13] to [17], wherein the alkenyl-substituted nadimide compound (D) comprises a compound represented by the following formula (4) and/or (5):

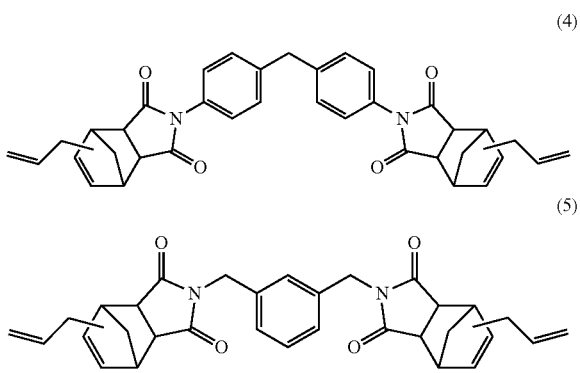

[19]

The resin composition according to any one of [13] to [18], wherein the maleimide compound (B) comprises at least one selected from the group consisting of bis(4-maleimidephenyl)methane, 2,2-bis{4-(4-maleimidephenoxy)-phenyl}propane, bis(3-ethyl-5-methyl-4-maleimidephenyl) methane, and a maleimide compound represented by the following formula (6):

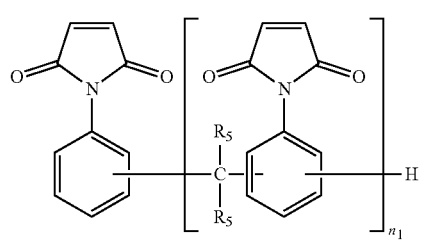

wherein each $R_5$ independently represents a hydrogen atom or a methyl group, and $n_1$ represents an integer of 1 or more.

[20]

The resin composition according to any one of [13] to [19], wherein the allyl group-containing compound comprises a compound represented by the following formula (7):

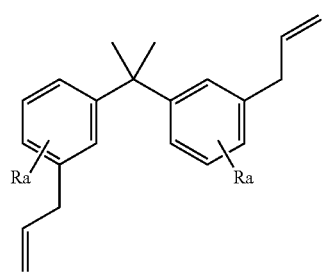

wherein each Ra independently represents the reactive functional group other than an allyl group.

[21]

The resin composition according to any one of [13] to [20], further comprising a filler (C).

[22]

The resin composition according to [21], wherein the filler (C) comprises boehmite and/or a silica.

[23]

The resin composition according to any one of [13] to [22], wherein a content of the alkenyl-substituted nadimide compound (D) is 25 to 90 parts by mass based on 100 parts by mass of a resin solid content.

[24]

The resin composition according to any one of [13] to [23], wherein a content of the maleimide compound (B) is 35 to 65 parts by mass based on 100 parts by mass of a resin solid content.

[25]

The resin composition according to any one of [13] to [24], wherein a content of the allyl group-containing compound (A) is 1.0 to 15 parts by mass based on 100 parts by mass of a resin solid content.

[26]

The resin composition according to any one of [14] to [25], wherein a content of the epoxy resin is 2.5 to 30 parts by mass based on 100 parts by mass of a resin solid content.

[27]

The resin composition according to any one of [21] to [26], wherein a content of the filler (C) is 80 to 300 parts by mass based on 100 parts by mass of a resin solid content.

[28]

A prepreg comprising:
a base material; and
the resin composition according to any one of [1] to [27] impregnated in or coated on the base material.

[29]

The prepreg according to [28], wherein the base material is at least one selected from the group consisting of E glass cloth, T glass cloth, S glass cloth, Q glass cloth, and an organic fiber.

[30]

A resin sheet comprising:
a sheet base material; and
the resin composition according to any one of [1] to [27] laminated on one side or both sides of the sheet base material.

[31]

A metal foil-clad laminate comprising:
at least one layer of the prepreg according to [28] or [29], or the resin sheet according to claim 30; and
a metal foil disposed on one side or both sides of the prepreg or the resin sheet.

[32]

A printed circuit board, comprising an insulating layer and a conductive layer formed on a surface of the insulating layer,
wherein the insulating layer contains the resin composition according to any one of [1] to [27].

Advantageous Effects of Invention

According to the present invention, a resin composition providing a cured product, which is excellent in flexural strength and flexural modulus, has a low dielectric constant and a high glass transition temperature (high Tg), has a low coefficient of thermal expansion and has excellent thermal conductivity, and a prepreg, a metal foil-clad laminate and a printed circuit board all using the resin composition can be provided. Besides, according to another aspect of the present invention, a resin composition providing a cured product, which is excellent in a low coefficient of thermal expansion, a high Tg and high copper foil peel strength, and is excellent also in elastic modulus retention, heat resistance after moisture absorption, desmear resistance and chemical resistance, and a prepreg, a metal foil-clad laminate and a printed circuit board all using the resin composition can be also provided.

DESCRIPTION OF EMBODIMENTS

An embodiment for practicing the present invention (hereinafter referred to as the "present embodiment") will now be described in detail, and it is noted that the present invention is not limited to this embodiment but may be variously modified within the spirit and the scope of the present invention.

[First Embodiment: Resin Composition]

A resin composition of a first embodiment comprises an allyl group-containing compound (A) and a maleimide compound (B), and the allyl group-containing compound (A) has a reactive functional group other than an allyl group.

[Allyl Group-containing Compound (A)]

The allyl group-containing compound (A) has a reactive functional group other than an allyl group. The reactive functional group other than an allyl group is not especially limited, and examples thereof include a cyanate group, a hydroxyl group, an epoxy group, an amine group, an isocyanate group, a glycidyl group and a phosphoric acid group. Among these, at least one selected from the group consisting of a cyanate group, a hydroxyl group and an epoxy group is preferably used, and a cyanate group is more preferably used. If the compound has a hydroxyl group, a cyanate group or an epoxy group, there is a tendency that the resultant has high flexural strength and high flexural modulus, a low dielectric constant, a high glass transition temperature, a low coefficient of thermal expansion and improved thermal conductivity.

As the allyl group-containing compound (A), one compound may be singly used, or two or more compounds may be used together. If two or more compounds are used together, the reactive functional group other than an allyl group may be the same or different between the compounds. In particular, the allyl group-containing compound (A) preferably contains an allyl group-containing compound having a cyanate group as the reactive functional group and an allyl group-containing compound having an epoxy group as the reactive functional group. When these allyl group-containing compounds (A) are used together, the resultant tends to be further improved in the flexural strength, the flexural modulus, the glass transition temperature and the thermal conductivity.

The allyl group-containing compound (A) is not especially limited, and examples thereof include bisphenol in which a hydrogen element of an aromatic ring is substituted with an allyl group, and a modified bisphenol compound in which a hydrogen element of an aromatic ring is substituted with an allyl group and a phenol-based hydroxyl group is substituted with a reactive functional group other than a hydroxyl group, specific examples thereof include a compound represented by the following formula (7), and more specific examples thereof include diallyl bisphenol A, a cyanate ester compound of diallyl bisphenol A, and diallyl bisphenol A-based epoxy.

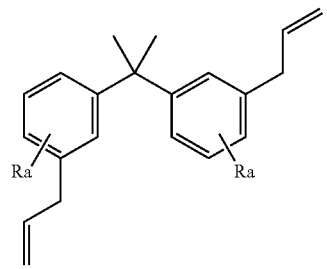

(7)

wherein each Ra independently represents the reactive functional group other than an allyl group.

The compound represented by formula (7) is not especially limited, and examples thereof include a compound represented by the following formula (7-1) and/or a compound represented by the following formula (7-2). When such an allyl group-containing compound (A) is used, the resultant tends to be further improved in the flexural strength, the flexural modulus, the glass transition temperature, the coefficient of thermal expansion, the thermal conductivity and the copper foil peel strength.

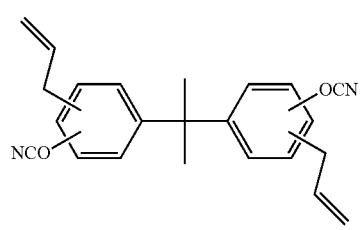

(7-1)

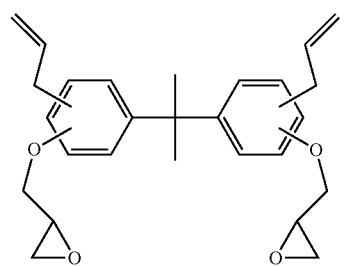

(7-2)

The bisphenol is not especially limited, and examples thereof include bisphenol A, bisphenol AP, bisphenol AF, bisphenol B, bisphenol BP, bisphenol C, bisphenol C, bisphenol E, bisphenol F, bisphenol G, bisphenol M, bisphenol S, bisphenol P, bisphenol PH, bisphenol TMC, and bisphenol Z. Among these, bisphenol A is preferably used.

The number of allyl groups in one molecule of the allyl group-containing compound (A) is preferably 1 to 5, more preferably 2 to 4, and further preferably 2. When the number of allyl groups in one molecule of the allyl group-containing compound (A) falls within the above-described range, there is a tendency that the flexural strength, the flexural modulus, the copper foil peel strength and the glass transition temperature (Tg) are further improved, that the coefficient of thermal expansion is low, and that the thermal conductivity is excellent.

The number of reactive functional groups in one molecule of the allyl group-containing compound (A) is preferably 1 to 5, more preferably 2 to 4, and further preferably 2. When the number of reactive functional groups in one molecule of the allyl group-containing compound (A) falls within the above-described range, there is a tendency that the flexural strength, the flexural modulus, the copper foil peel strength and the glass transition temperature (Tg) is further improved, that the coefficient of thermal expansion is low, and that the thermal conductivity is excellent.

A content of the allyl group-containing compound (A) is preferably 1 to 90 parts by mass, more preferably 10 to 80 parts by mass, and further preferably 20 to 75 parts by mass, based on 100 parts by mass of a resin solid content. When the content of the allyl group-containing compound (A) falls within the above-described range, the softness, the flexural strength, the flexural modulus, the glass transition temperature (Tg), the coefficient of thermal expansion, the thermal conductivity and the copper foil peel strength of a resultant cured product tend to be further improved. It is noted that the term "resin solid content" used herein refers to components of the resin composition excluding a solvent and a filler (C) unless otherwise mentioned, and that the term "100 parts by mass of the resin solid content" means that the sum of the components of the resin composition excluding a solvent and a filler (C) is 100 parts by mass.

[Maleimide Compound (B)]

The maleimide compound (B) is not especially limited as long as it is a compound having one or more maleimide groups in one molecule, and examples thereof include N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, a maleimide compound represented by the following formula (6), prepolymers of these maleimide compounds, and a prepolymer of a maleimide compound and an amine compound. Among these, at least one selected from the group consisting of bis(4-maleimidephenyl)methane, 2,2-bis{4-(4-maleimidephenoxy)-phenyl}propane, bis(3-ethyl-5-methyl-4-maleimidephenyl)methane, and a maleimide compound represented by the following formula (6) is preferably used. When such a maleimide compound (B) is contained, the resultant cured product tends to have a further lower coefficient of thermal expansion, and to be further improved in the heat resistance and the glass transition temperature.

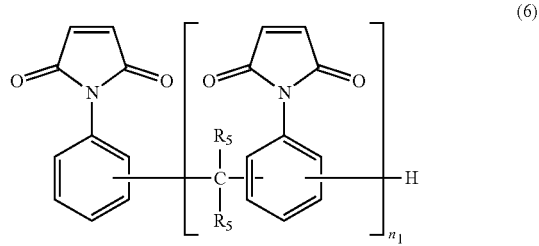

(6)

wherein each $R_5$ independently represents a hydrogen atom or a methyl group, and $n_1$ represents an integer of 1 or more.

In formula (6), $R_5$ represents a hydrogen atom or a methyl group, and preferably a hydrogen atom.

In formula (6), $n_1$ represents an integer of 1 or more. Preferably, $n_1$ is 10 or less, and more preferably 7 or less.

A content of the maleimide compound (B) is preferably 10 to 70 parts by mass, more preferably 20 to 60 parts by mass, and further preferably 25 to 50 parts by mass, based on 100 parts by mass of the resin solid content. When the content of the maleimide compound (B) falls within the above-described range, there is a tendency that the coefficient of thermal expansion of the resultant cured product is further lowered, and that the heat resistance is further improved.

[Filler (C)]

The resin composition of the first embodiment may further contains a filler (C). The filler (C) is not especially limited, and examples thereof include an inorganic filler and an organic filler. As the filler (C), one filler may be singly used, or two or more fillers may be used together.

The inorganic filler is not especially limited, and examples thereof include silicas such as natural silica, fused silica, synthetic silica, amorphous silica, aerosil and hollow silica; silicon compounds such as white carbon; metal oxides such as titanium white, zinc oxide, magnesium oxide and zirconium oxide; metal nitrides such as boron nitride, agglomerated boron nitride, silicon nitride and aluminum nitride; metal sulfates such as barium sulfate; metal hydroxides such as aluminum hydroxide, heat-treated aluminum hydroxide (aluminum hydroxide having been subjected to a heat treatment for reducing a part of water of crystallization), boehmite and magnesium hydroxide; molybdenum compounds such as molybdenum oxide and zinc molybdate; zinc compounds such as zinc borate and zinc stannate; alumina, clay, kaolin, talc, calcined clay, calcined kaolin, calcined talc, mica, E-glass, A-glass, NE-glass, C-glass, L-glass, D-glass, S-glass, M-glass G20, short glass fiber (including fine glass powders of E glass, T glass, D glass, S glass, Q glass and the like), hollow glass and spherical glass. Besides, the organic filler is not especially limited, and examples thereof include rubber powders such as a styrene-based powder, a butadiene-based powder and an acrylic-based powder; a core-shell type rubber powder; a silicone resin powder; a silicone rubber powder; and a silicone composite powder.

Among these, at least one selected from the group consisting of silica, alumina, magnesium oxide, aluminum hydroxide, boehmite, boron nitride, agglomerated boron nitride, silicon nitride and aluminum nitride is preferably contained, and at least one selected from the group consisting of alumina, boron nitride, agglomerated boron nitride, silicon nitride and aluminum nitride is more preferably contained. When such a filler (C) is used, the thermal conductivity tends to be further improved.

A content of the filler (C) is preferably 50 to 1600 parts by mass, more preferably 50 to 1000 parts by mass, and further preferably 75 to 300 parts by mass, based on 100 parts by mass of the resin solid content. When the content of the filler (C) falls within the above-described range, the thermal conductivity tends to be further improved.

[Silane Coupling Agent and Wetting and Dispersing Agent]

The resin composition of the first embodiment may further contains a silane coupling agent and a wetting and dispersing agent. When a silane coupling agent and a wetting and dispersing agent are contained, the resultant tends to be further improved in the dispersibility of the filler (C) and adhesion strength among the resin component, the filler (C) and a base material described later.

The silane coupling agent is not especially limited as long as it is generally used for a surface treatment of an inorganic substance, and examples thereof include aminosilane-based compounds such as γ-aminopropyltriethoxysilane and N-β-

(aminoethyl)-γ-aminopropyltrimethoxysilane; epoxysilane-based compounds such as γ-glycidoxypropyltrimethoxysilane; acrylsilane compounds such as γ-acryloxypropyltrimethoxysilane; cationic silane-based compounds such as N-β-(N-vinylbenzylaminoethyl)-γ-aminopropyltrimethoxysilane hydrochloride; and phenylsilane-based compounds. One of these silane coupling agents may be singly used, or two or more of these may be used together.

The wetting and dispersing agent is not especially limited as long as it is a dispersion stabilizer used for a paint, and examples thereof include DISPER-110, 111, 118, 180 and 161, and BYK-W99.6, W9010 and W903 manufactured by BYK Japan K. K.

[Additional Resin, Etc.]

The resin composition of the first embodiment may further contains, if necessary, one, or two or more selected from the group consisting of an allyl group-containing compound different from the above-described allyl group-containing compound (A) (hereinafter also referred to as the "additional allyl group-containing compound"), a cyanate ester compound, an epoxy resin, a phenol resin, an oxetane resin, a benzoxazine compound, and a compound having a polymerizable unsaturated group. When such an additional resin or the like are contained, the resultant tends to be further improved in the copper foil peel strength, the flexural strength and the flexural modulus.

[Additional Allyl Group-Containing Compound]

The additional allyl group-containing compound is not especially limited, and examples thereof include allyl chloride, allyl acetate, allyl ether, propylene, triallyl cyanurate, triallyl isocyanurate, diallyl phthalate, diallyl isophthalate and diallyl maleate.

A content of the additional allyl group-containing compound is preferably 10 to 45% by mass, more preferably 15 to 45% by mass and further preferably 20 to 35% by mass, based on 100 parts by mass of the resin solid content. When the content of the additional allyl group-containing compound falls within the above-described range, the resultant tends to be further improved in the flexural strength, the flexural modulus, the heat resistance and the chemical resistance.

[Cyanate Ester Compound]

The cyanate ester compound is not especially limited, and examples thereof include a naphthol aralkyl-based cyanate ester represented by the following formula (8), a novolac-based cyanate ester represented by the following formula (9), a biphenyl aralkyl-based cyanate ester, bis(3,5-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl)thioether, bis(4-cyanatophenyl)sulfone, and 2,2'-bis(4-cyanatophenyl)propane; and prepolymers of such cyanate esters. One of these cyanate ester compounds may be singly used, or two or more of these may be used in combination.

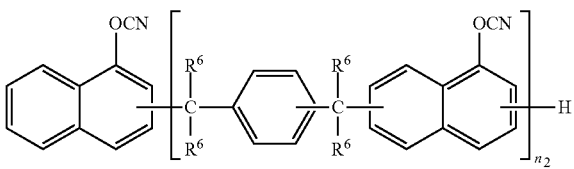

(8)

In formula (8), each $R^6$ independently represents a hydrogen atom or a methyl group, and preferably a hydrogen atom. Besides, in formula (8), $n_2$ represents an integer of 1 or more. The upper limit of $n_2$ is usually 10, and preferably 6.

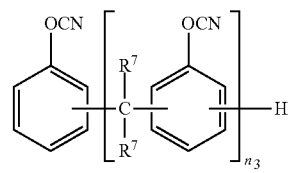

(9)

In formula (9), each $R^7$ independently represents a hydrogen atom or a methyl group, and preferably a hydrogen atom. Besides, in formula (9), $n_3$ represents an integer of 1 or more. The upper limit of $n_3$ is usually 10, and preferably 7.

In particular, the cyanate ester compound preferably contains one or more selected from the group consisting of the naphthol aralkyl-based cyanate ester represented by formula (8), the novolac-based cyanate ester represented by formula (9), and biphenyl aralkyl-based cyanate ester, and more preferably contains one or more selected from the group consisting of the naphthol aralkyl-based cyanate ester represented by formula (8) and the novolac-based cyanate ester represented by formula (9). When such a cyanate ester compound is used, there is a tendency that a cured product excellent in flame retardancy, having higher curability and having a lower coefficient of thermal expansion can be obtained.

A method for producing the cyanate ester compound is not especially limited, and any of methods known as a synthesis method for a cyanate ester compound can be employed. Examples of the known methods include, but are not limited to, a method in which a phenol resin and halogenated cyan are reacted with each other in an inert organic solvent in the presence of a basic compound, and a method in which a salt of a phenol resin and a basic compound is formed in a solution containing water, followed by causing a two-phase interfacial reaction between the resultant salt and halogenated cyan.

The phenol resin usable as a material of the cyanate ester compound is not especially limited, and examples thereof include a naphthol aralkyl-based phenol resin represented by the following formula (10), a novolac-based phenol resin and a biphenyl aralkyl-based phenol resin:

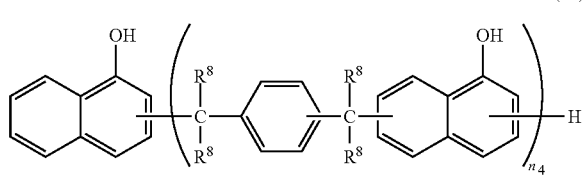

(10)

In formula (10), each $R^8$ independently represents a hydrogen atom or a methyl group, and preferably a hydrogen atom. Besides, in formula (10), $n_4$ represents an integer of 1 or more. The upper limit of $n_4$ is usually 10, and preferably 6.

The naphthol aralkyl-based phenol resin represented by formula (10) can be obtained by condensation of a naphthol aralkyl resin and cyanic acid. Here, the naphthol aralkyl-based phenol resin is not especially limited, and examples thereof include those obtained by reacting naphthols, such as α-naphthol and β-naphthol, with benzenes such as p-xylylene glycol, α,α'-dimethoxy-p-xylene, and 1,4-di(2-hydroxy-2-propyl)benzene. The naphthol aralkyl-based cyanate ester can be selected from those obtained by the condensation of a naphthol aralkyl-based resin obtained as described above and cyanic acid.

A content of the cyanate ester compound is preferably 10 to 45% by mass, more preferably 15 to 45% by mass, and further preferably 20 to 35% by mass, based on 100 parts by mass of the resin solid content. When the content of the cyanate ester compound falls within the above-described range, the resultant tends to be further improved in the heat resistance and the chemical resistance.

[Epoxy Resin]

The epoxy resin is not especially limited as long as it is a compound having two or more epoxy groups in one molecule, and examples thereof include a bisphenol A-based epoxy resin, a bisphenol E-based epoxy resin, a bisphenol F-based epoxy resin, a bisphenol S-based epoxy resin, a phenol novolac-based epoxy resin, a bisphenol A novolac-based epoxy resin, a cresol novolac-based epoxy resin, a biphenyl-based epoxy resin, a naphthalene-based epoxy resin, a trifunctional phenol-based epoxy resin, a tetrafunctional phenol-based epoxy resin, a glycidyl ester-based epoxy resin, a phenol aralkyl-based epoxy resin, a biphenyl aralkyl-based epoxy resin, an aralkyl novolac-based epoxy resin, a naphthol aralkyl-based epoxy resin, a dicyclopentadiene-based epoxy resin, a polyol-based epoxy resin, an isocyanurate ring-containing epoxy resin, and halides of these. Incidentally, if the allyl group-containing compound has an epoxy group, and an epoxy resin is used, the epoxy resin is a compound different from the allyl group-containing compound having an epoxy group.

A content of the epoxy resin is preferably 2.5 to 30 parts by mass, more preferably 5.0 to 27.5 parts by mass, and further preferably 7.5 to 25 parts by mass, based on 100 parts by mass of the resin solid content. When the content of the epoxy resin falls within the above-described range, there is a tendency that the resultant cured product is further improved in the softness, the copper foil peel strength, the chemical resistance and the desmear resistance.

[Phenol Resin]

The type of phenol resin is not especially limited but any of known resins can be used as long as it has two or more hydroxyl groups in one molecule. Specific examples thereof include, but are not limited to, a bisphenol A-based phenol resin, a bisphenol E-based phenol resin, a bisphenol F-based phenol resin, a bisphenol S-based phenol resin, a phenol novolac resin, a bisphenol A novolac-based phenol resin, a glycidyl ester-based phenol resin, an aralkyl novolac-based phenol resin, a biphenyl aralkyl-based phenol resin, a cresol novolac-based phenol resin, a polyfunctional phenol resin, a naphthol resin, a naphthol novolac resin, a polyfunctional naphthol resin, an anthracene-based phenol resin, a naphthalene skeleton-modified novolac-based phenol resin, a phenol aralkyl-based phenol resin, a naphthol aralkyl-based phenol resin, a dicyclopentadiene-based phenol resin, a biphenyl-based phenol resin, an alicyclic phenol resin, a polyol-based phenol resin, a phosphorus-containing phenol resin, and a hydroxyl group-containing silicone resin. One of these phenol resins can be singly used, or a combination of two or more of these can be used. When the resin composition of the first embodiment contains the phenol resin, the resultant tends to be further excellent in the adhesiveness, flexibility and the like.

A content of the phenol resin is preferably 0 to 99 parts by mass, more preferably 1 to 90 parts by mass, and further preferably 3 to 80 parts by mass, based on 100 parts by mass of the resin solid content. When the content of the phenol resin falls within the above-described range, the resultant tends to be further excellent in the adhesiveness, the flexibility and the like.

[Oxetane Resin]

As the oxetane resin, any of generally known oxetane resins can be used, and the type is not especially limited. Specific examples thereof include oxetane, alkyl oxetanes such as 2-methyl oxetane, 2,2-dimethyl oxetane, 3-methyl oxetane and 3,3-dimethyl oxetane, 3-methyl-3-methoxymethyl oxetane, 3,3'-di(trifluoromethyl)perfluoroxetane, 2-chloromethyl oxetane, 3,3-bis(chloromethyl)oxetane, biphenyl-based oxetane, OXT-101 (trade name, manufactured by Toagosei Co., Ltd.) and OXT-121 (trade name, manufactured by Toagosei Co., Ltd.). One of or a combination of two or more of these oxetane resins can be used. When the resin composition of the first embodiment contains the oxetane resin, the resultant tends to be further improved in the adhesiveness, the flexibility and the like.

A content of the oxetane resin is preferably 0 to 99 parts by mass, more preferably 1 to 90 parts by mass, and further preferably 3 to 80 parts by mass, based on 100 parts by mass of the resin solid content. When the content of the oxetane resin falls within the above-described range, the resultant tends to be further improved in the adhesiveness, the flexibility and the like.

[Benzoxazine Compound]

Any of generally known benzoxazine compounds can be used as the benzoxazine compound as long as it is a compound having two or more dihydrobenzoxazine rings in one molecule, and the type is not especially limited. Specific examples thereof include bisphenol A-based benzoxazine BA-BXZ (trade name, manufactured by Konishi Chemical Ind Co., Ltd.), bisphenol F-based benzoxazine BF-BXZ (trade name, manufactured by Konishi Chemical Ind Co., Ltd.), and bisphenol S-based benzoxazine BS-BXZ (trade name, manufactured by Konishi Chemical Ind Co., Ltd.). One of or a mixture of two or more of these benzoxazine compounds can be used. When the resin composition of the first embodiment contains the benzoxazine compound, the resultant tends to be further excellent in the flame retardancy, the heat resistance, the water absorption, the low dielectric constant and the like.

A content of the benzoxazine compound is preferably 0 to 99 parts by mass, more preferably 1 to 90 parts by mass, and further preferably 3 to 80 parts by mass, based on 100 parts by mass of the resin solid content. When the content of the benzoxazine compound falls within the above-described range, the resultant tends to be further excellent in the heat resistance and the like.

[Compound Having Polymerizable Unsaturated Group]

As the compound having a polymerizable unsaturated group, any of generally known compounds can be used, and the type is not especially limited. Specific examples thereof include vinyl compounds such as ethylene, propylene, styrene, divinylbenzene and divinyl biphenyl; monohydric or polyhydric alcohol (meth)acrylates such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate and dipentaerythritol hexa(meth)acrylate; epoxy (meth)acrylates such as bisphenol A-based epoxy (meth)acrylate, and bisphenol F-based epoxy (meth)acrylate; benzocyclobutene resins; and (bis)maleimide resins. One of or a mixture of two or more of these compounds having an unsaturated group can be used. When the resin composition of the first embodiment contains the compound having a polymerizable unsaturated group, the resultant tends to be further improved in the heat resistance, toughness and the like.

A content of the compound having a polymerizable unsaturated group is preferably 0 to 99 parts by mass, more preferably 1 to 90 parts by mass, and further preferably 3 to 80 parts by mass, based on 100 parts by mass of the resin solid content. When the content of the compound having a polymerizable unsaturated group falls within the above-described range, the resultant tends to be further excellent in the heat resistance, the toughness and the like.

[Curing Accelerator]

The resin composition of the first embodiment may further contains a curing accelerator. The curing accelerator is not especially limited, and examples thereof include imidazoles such as triphenyl imidazole; organic peroxides such as benzoyl peroxide, lauroyl peroxide, acetyl peroxide, para-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in any of hydroxyl group-containing compounds such as phenol and bisphenol; inorganic metal salts such as tin chloride, zinc chloride, and aluminum chloride; and dioctyl tin oxide and other organic tin compounds such as alkyl tin and alkyl tin oxide. Among these, triphenyl imidazole is particularly preferred because there is a tendency that it accelerates a curing reaction and that the resultant is excellent in the glass transition temperature and the coefficient of thermal expansion.

[Solvent]

The resin composition of the first embodiment may further contains a solvent. When a solvent is contained, the viscosity of the resin composition is lowered during the preparation, and hence there is a tendency that the handleability is further improved as well as the ability of impregnating the base material described later is further improved.

The solvent is not especially limited as long as it can dissolve a part or the whole of the resin component of the resin composition, and examples thereof include ketones such as acetone, methyl ethyl ketone and methyl cellosolve; aromatic hydrocarbons such as toluene and xylene; amides such as dimethylformamide; and propylene glycol monomethyl ether and acetate thereof. One of these solvents may be singly used, or two or more of these may be used together.

The term "elastic modulus retention" refers to one obtained by measuring flexural moduli at 25° C. and 250° C. in accordance with JIS C6481 and calculating a difference between the flexural modulus (a) at 25° C. and the flexural modulus (b) under heat at 250° C. thus obtained in accordance with the following formula. Incidentally, being excellent in the elastic modulus retention means that a difference, for example, between the flexural modulus at 25° C. and the flexural modulus (under heat) at 250° C. is small.

$$\text{Elastic modulus retention} = [(b)/(a)] \times 100$$

[Second Embodiment: Resin Composition]

A resin composition according to a second embodiment comprises an allyl group-containing compound (A), a maleimide compound (B), and an alkenyl-substituted nadimide compound (D), and the allyl group-containing compound (A) has a reactive functional group other than an allyl group.

A resin composition containing an alkenyl-substituted nadimide compound (D) and a maleimide compound (B) can provide a cured product having a high glass transition temperature (Tg) and a low coefficient of thermal expansion. When the resin composition further comprises an allyl group-containing compound (A), a higher glass transition temperature, a lower coefficient of thermal expansion and high copper foil peel strength can be imparted to the resultant cured product. Although not restrictive, this is achieved by a reaction between a maleimide group derived from the maleimide compound (B) and an allyl group of the allyl group-containing compound (A), both of which groups are present in a skeleton of the cured product made of the alkenyl-substituted nadimide compound (D) and the maleimide compound (B).

[Allyl Group-containing Compound (A)]

Examples of the allyl group-containing compound (A) include those mentioned as the examples in the first embodiment. In particular, the reactive functional group is preferably at least one selected from the group consisting of a cyanate group, a hydroxyl group and an epoxy group, and is more preferably a cyanate group. When such a functional group is contained, the resultant tends to be further improved in the copper foil peel strength and the heat resistance. Besides, the allyl group-containing compound preferably contains a compound represented by the following formula (7). When such an allyl group-containing compound (A) is used, the resultant tends to be further improved in the copper foil peel strength and the heat resistance.

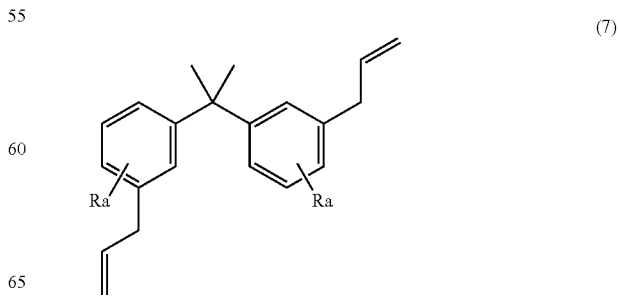

(7)

wherein each Ra independently represents the reactive functional group other than an allyl group.

A content of the allyl group-containing compound (A) is preferably 1.0 to 15 parts by mass, more preferably 2.0 to 12.5 parts by mass, and further preferably 3.0 to 10 parts by mass, based on 100 parts by mass of a resin solid content. When the content of the allyl group-containing compound (A) falls within the above-described range, the softness, the copper peel strength, the chemical resistance and the desmear resistance of the resultant cured product tend to be further improved.

[Maleimide Compound (B)]

Examples of the maleimide compound (B) include those mentioned as the examples in the first embodiment. In particular, the maleimide compound (B) preferably contains at least one selected from the group consisting of bis(4-maleimidephenyl)methane, 2,2-bis{4-(4-maleimidephenoxy)-phenyl}propane, bis(3-ethyl-5-methyl-4-maleimidephenyl)methane, and a maleimide compound represented by the following formula (6). When such a maleimide compound (B) is contained, there is a tendency that the coefficient of thermal expansion of the resultant cured product is further lowered, and that the heat resistance and the glass transition temperature are further improved.

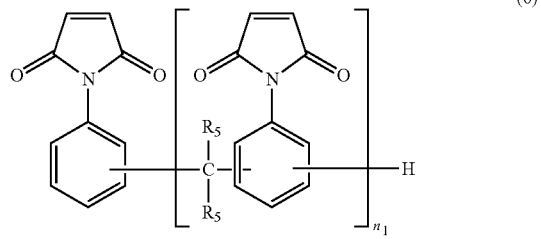

(6)

wherein each $R_5$ independently represents a hydrogen atom or a methyl group, and $n_1$ represents an integer of 1 or more.

A content of the maleimide compound (B) is preferably 35 to 65 parts by mass, more preferably 37.5 to 62.5 parts by mass, and further preferably 40 to 60 parts by mass, based on 100 parts by mass of the resin solid content. When the content of the maleimide compound (B) falls within the above-described range, there is a tendency that the coefficient of thermal expansion of the resultant cured product is further lowered, and that the heat resistance is further improved.

[Alkenyl-substituted Nadimide Compound (D)]

The alkenyl-substituted nadimide compound (D) is not especially limited as long as it is a compound having one or more alkenyl-substituted nadimide groups in a molecule. In particular, a compound represented by the following formula (1) is preferably used. When such an alkenyl-substituted nadimide compound (D) is used, there is a tendency that the coefficient of thermal expansion of the resultant cured product is further lowered, and that the heat resistance is further improved.

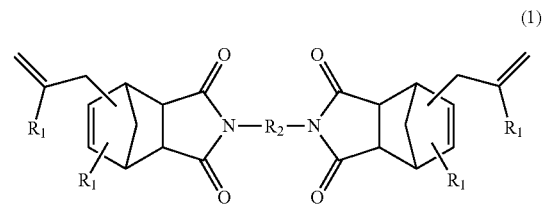

(1)

wherein each $R_1$ independently represents a hydrogen atom or an alkyl group having 1 to 6 carbon atoms, $R_2$ represents an alkylene group having 1 to 6 carbon atoms, a phenylene group, a biphenylene group, a naphthylene group, or a group represented by the following formula (2) or (3):

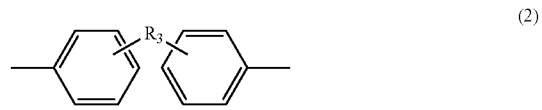

(2)

wherein $R_3$ represents a methylene group, an isopropylidene group, or a substituent represented by CO, O, S or $SO_2$; and

(3)

wherein each $R_4$ independently represents an alkylene group having 1 to 4 carbon atoms, or a cycloalkylene group having 5 to 8 carbon atoms.

The alkenyl-substituted nadimide compound (D) is preferably a compound represented by the following formula (4) and/or (5). When such an alkenyl-substituted nadimide compound (D) is used, there is a tendency that the coefficient of thermal expansion of the resultant cured product is further lowered, and that the heat resistance is further improved.

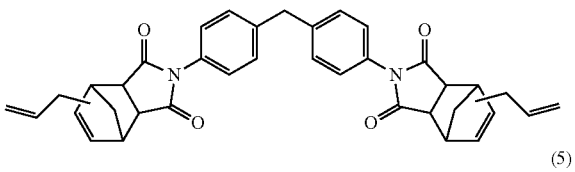

(4)

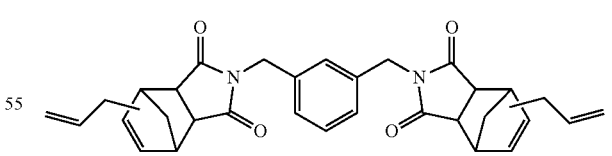

(5)

Alternatively, a commercially available compound can be used as the alkenyl-substituted nadimide compound (D). Examples of the commercially available compound include, but are not limited to, BANI-M (manufactured by Maruzen Petrochemical Co., Ltd., a compound represented by formula (4)) and BANI-X (manufactured by Maruzen Petrochemical Co., Ltd., a compound represented by formula (5)). One of or a combination of two or more of these compounds may be used.

A content of the alkenyl-substituted nadimide compound (D) is preferably 25 to 90 parts by mass, more preferably 27.5 to 87.5 parts by mass, and further preferably 30 to 85 parts by mass, based on 100 parts by mass of the resin solid content. When the content of the alkenyl-substituted nadimide compound (D) falls within the above-described range, there is a tendency that the coefficient of thermal expansion of the resultant cured product is further lowered, and that the heat resistance is further improved.

In the resin composition of the second embodiment, a ratio of the number of maleimide groups ($\beta$) in the maleimide compound (B) to the sum of the number of alkenyl groups ($\alpha$) in the alkenyl-substituted nadimide compound (D) and the number of allyl groups ($\alpha'$) in the allyl group-containing compound (A) (a ratio ($\beta/(\alpha+\alpha')$)) is preferably 0.9 to 4.3, and more preferably 1.5 to 4.0. When the ratio ($\beta/(\alpha+\alpha')$) falls within the above-described range, there is a tendency that the coefficient of thermal expansion of the resultant cured product is further lowered, and that the heat resistance is further improved.

[Filler (C)]

The resin composition of the second embodiment may further comprises a filler (C). As the filler (C), any of those mentioned as the examples in the first embodiment can be used. In particular, boehmite and/or a silica it preferably used. When such a filler (C) is used, the coefficient of the thermal expansion tends to be further lowered.

A content of the filler (C) is preferably 80 to 300 parts by mass, more preferably. 90 to 300 parts by mass, and further preferably 95 to 300 parts by mass, based on 100 parts by mass of the resin solid content. When the content of the filler (C) falls within the above-described range, the coefficient of thermal expansion tends to be further lowered.

[Silane Coupling Agent and Wetting and Dispersing Agent]

The resin composition of the second embodiment may contain a silane coupling agent or a wetting and dispersing agent if necessary. As the silane coupling agent and the wetting and dispersing agent, any of those mentioned as the examples in the first embodiment can be used.

[Epoxy Resin]

The resin composition of the second embodiment may further comprises an epoxy resin if necessary. As the epoxy resin, any of those mentioned as the examples in the first embodiment can be used. In particular, an epoxy resin having a softening point of 50° C. or more is more preferably used from the viewpoint of a low coefficient of thermal expansion and a high glass transition temperature. When the epoxy resin is further contained, the copper foil peel strength of the resultant cured product tends to be further improved. Although not restrictive, the reason is that such improvement can be achieved by a reaction between the reactive functional group of the allyl group-containing compound (A) and an epoxy group of the epoxy resin. More specifically, in an aspect where the epoxy resin is contained, the allyl group-containing compound (A) can work as a linker for linking the epoxy resin to the skeleton of the cured product made of the alkenyl-substituted nadimide compound (D) and the maleimide compound (B). In this manner, the alkenyl-substituted nadimide compound (D) and the maleimide compound (B), which are capable of providing a cured product having a high glass transition temperature (Tg), low coefficient of thermal expansion and high heat resistance, and the epoxy resin capable of providing a cured product having a, high copper foil peel strength can be compounded. Incidentally, if the allyl group-containing compound (A) has an epoxy group, and the epoxy resin is used, the epoxy resin is a compound different from the allyl group-containing compound (A) having an epoxy group.

A content of the epoxy resin is preferably 2.5 to 30 parts by mass, more preferably 5.0 to 27.5 parts by mass, and further preferably 7.5 to 25 parts by mass, based on 100 parts by mass of the resin solid content. When the content of the epoxy resin falls within the above-described range, the softness, the copper foil peel strength, the chemical resistance and the desmear resistance of the resultant cured product tend to be further improved.

[Solvent]

The resin composition of the second embodiment may contain a solvent if necessary. As the solvent, any of those mentioned as the examples in the first embodiment can be used.

[Curing Accelerator]

The resin composition of the second embodiment may contain a curing accelerator if necessary. As the curing accelerator, any of those mentioned as the examples in the first embodiment can be used.

[Production Method for Resin Composition]

A production method for the resin composition of the first or second embodiment is not especially limited, and for example, a method in which the respective components are successively blended with the solvent followed by sufficient stirring can be employed. In this case, in order to homogeneously dissolve or disperse the respective components, any of known treatments such as stirring, mixing and kneading treatments can be performed. Specifically, the dispersibility of the filler (C) in the resin composition can be improved by performing a stirring and dispersing treatment using a stirring vessel equipped with a stirrer having appropriate stirring ability. The stirring, mixing and kneading treatments can be appropriately performed using a known apparatus, for example, an apparatus aimed at mixing, such as a ball mill and a bead mill, or a revolution or rotation type mixer.

Besides, in preparation of the resin composition of the first or second embodiment, an organic solvent can be used if necessary. The type of the organic solvent is not especially limited as long as it can dissolve a resin contained in the resin composition. Specific examples thereof include those mentioned above.

[Use]

The resin composition of the first or second embodiment can be suitably used as a prepreg, a resin sheet, an insulating layer, a metal foil-clad laminate or a printed circuit board. Now, the prepreg, the resin sheet, the metal foil-clad laminate and the printed circuit board will be described.

[Prepreg]

The prepreg according to a present embodiment includes a base material, and the above-described resin composition impregnated in or coated on the base material. The prepreg can be produced by a usual method, and the method is not especially limited. For example, after impregnating or coating the base material with the resin component of the present embodiment, the resultant is semi-cured (converted to B-stage) by, for example, heating in a dryer at 100 to 200° C. for 1 to 30 minutes, and thus, the prepreg of the present embodiment can be produced.

A content of the resin composition (including the filler (C)) is preferably 30 to 90% by mass, more preferably 35 to 85% by mass, and preferably 40 to 80% by mass, based on the total amount of the prepreg. When the content of the resin composition falls within the above-described range, the moldability tends to be further improved.

The base material is not especially limited, and any of known materials of various printed circuit boards can be appropriately selected to be used depending on the intended use or performance. Specific examples of a fiber contained in the base material include, but are not limited to, glass fibers such as E glass, D glass, S glass, Q glass, spherical glass, NE glass, L glass and T glass; inorganic fiber excluding glass such as quartz; wholly aromatic polyamides such as poly-para-phenylene terephthalamide (Kevlar®, manufactured by Du Pont K.K.) and co-poly-para-phenylene 3,4'-oxydiphenylene terephthalamide (Technora®, manufactured by Teijin Techno Products, Ltd.); polyesters such as 2,6-hydroxynaphthoic acid para-hydroxybenzoic acid (Vectran®, manufactured by Kuraray Co., Ltd.), and Zxion® (manufactured by KB Seiren, Ltd.); and organic fibers such as poly-para-phenylene benzoxazole (Zylon®, manufactured by Toyobo Co., Ltd.) and polyimide. Among these, at least one selected from the group consisting of E glass cloth, T glass cloth, S glass cloth, Q glass cloth and organic fibers is preferably used from the viewpoint of the low coefficient of thermal expansion. One of these base materials may be singly used, or two or more of these may be used together.

Examples of the form of the base material include, but are not especially limited to, a woven fabric, a nonwoven fabric, a robing, a chopped strand mat, and a surfacing mat. The texture of the woven fabric is not especially limited, and, for example, plain weave, mat weave, and twill weave are known, and the base material can be appropriately selected to be used from these known ones in accordance with the intended use or performance. A base material subjected to an opening treatment or a glass woven fabric surface-treated with a silane coupling agent or the like is suitably used. The base material is not especially limited by its thickness and mass, and one having a thickness of approximately 0.01 to 0.3 mm is usually suitably used. In particular, from the viewpoint of strength and water absorption, the base material is preferably a glass woven fabric having a thickness of 200 μm or less and a mass of 250 g/m² or less, and more preferably a glass woven fabric made of E glass, S glass, or T glass fiber.

[Resin Sheet]

The resin sheet of the present embodiment comprises a sheet base material (support), and the above-described resin composition laminated on one side or both sides of the sheet base material. A resin sheet is used as one method for thinning, and can be produced, for example, by coating a support made of a metal foil, a film or the like directly with a thermosetting resin (containing a filler (C)) for use in a prepreg or the like, and drying the resultant.

The sheet material is not especially limited, and any of known materials of various printed circuit boards can be used. Examples thereof include a polyimide film, a polyamide film, a polyester film, a polyethylene terephthalate (PET) film, a polybutylene terephthalate (PBT) film, a polypropylene (PP) film, a polyethylene (PE) film, an aluminum foil, a copper foil, and a gold foil. Among these, an electrolytic copper foil or a PET film is preferably used.

As a coating method, for example, a method in which a solution of the resin composition of the present embodiment dissolved in a solvent is coated on the sheet base material using a bar coater, a die coater, a doctor blade, a baker applicator or the like can be employed.

For obtaining the resin sheet, after coating the resin composition on the sheet base material, the resultant is preferably semi-cured (converted to B-stage). Specifically, after coating the resin composition on the sheet base material of a copper foil or the like, the resultant is semi-cured by, for example, heating in a dryer at 100 to 200° C. for 1 to 60 minutes, to produce the resin sheet. An amount of the resin composition caused to adhere to the sheet base material is preferably 1 to 300 μm in terms of a resin thickness in the resin sheet.

[Metal Foil-clad Laminate]

The metal foil-clad laminate of the present embodiment comprises an insulating layer, and a conductive layer laminated on one side or both sides of the insulating layer, and the insulating layer is made of the prepreg, the resin sheet or the resin composition described above. Specifically, the metal foil-clad laminate of the present embodiment is obtained by laminating, on a metal foil, at least one selected from the group consisting of the prepreg and the resin sheet, and curing the resultant.

The insulating layer may be the resin composition, single layer of the prepreg, or the resin sheet, or alternatively, may be two or more laminated layers of the resin composition, the prepreg or the resin sheet described above.

The conductive layer can be a metal foil of copper, aluminum or the like. The metal foil used here is not especially limited as long as it is used as a material of a printed circuit board, and is preferably a known copper foil such as a roller copper foil or an electrolytic copper foil. The thickness of the conductive layer is not especially limited, and is preferably 1 to 70 μm, and more preferably 1.5 to 35 μm.

The method and conditions for molding the metal foil-clad laminate is not especially limited, and a general method and conditions for a laminate for a printed circuit board and a multilayer board can be applied. For example, a multistage pressing machine, a multistage vacuum pressing machine, a continuous molding machine, or an autoclave molding machine can be used in the molding of the metal foil-clad laminate. In addition, in the molding of the metal foil-clad laminate, the temperature is set to 100 to 300° C., the pressure is set to a surface pressure of 2 to 100 kgf/cm², and the heating time is set to 0.05 to 5 hours in general. If necessary, post curing can be performed at a temperature of 150 to 300° C. Alternatively, the above-described prepreg may be lamination-molded in combination with a separately prepared wiring board for an inner layer to obtain a multilayer board.

[Printed Circuit Board]

The printed circuit board of the present embodiment is a printed circuit board comprising an insulating layer and a conductive layer formed on a surface of the insulating layer, and the insulating layer contains the above-described resin composition. When a prescribed wiring pattern is formed on the above-described metal foil-clad laminate, the resultant can be suitably used as the printed circuit board. The metal foil-clad laminate has a low coefficient of thermal expansion and good moldability and chemical resistance, and hence, it can be particularly effectively used as a printed circuit board for a semiconductor package requiring these performances.

Specifically, the printed circuit board of the present embodiment can be produced, for example, by the following method: First, the above-described metal foil-clad laminate (such as a copper-clad laminate) is prepared. The surface of the metal foil-clad laminate is subjected to an etching treatment for forming an inner layer circuit to produce an inner layer substrate. The surface of the inner layer circuit of the inner layer substrate is subjected to a surface treatment for increasing adhesion strength if necessary, a desired number of prepregs described above are then laminated on the resultant surface of the inner layer circuit, a metal foil for an outer layer circuit is further laminated on the outside thereof, and the resultant is integrally molded by heating and pressing. In this manner, a multilayer laminate in which the insulating layer composed of the base material and the cured product of the thermosetting resin composition are formed between the inner layer circuit and the metal foil for the outer layer circuit is produced. Subsequently, this multilayer laminate is subjected to hole drilling for through-holes or via holes and then subjected to a desmear treatment for removing smear, which is a resin residue derived from the resin component contained in the layer of the cured product. Thereafter, the inside walls of these holes are coated with a metal plating film for attaining electrical connection between the inner layer circuit and the metal foil for the outer layer circuit, and the metal foil for the outer layer circuit is further subjected to the etching treatment for forming the outer layer circuit, and thus, the printed circuit board is produced.

For example, the above-described prepreg (including the base material and the above-described resin composition adhering thereto) or a resin composition layer of the metal foil-clad laminate (the layer of the above-described resin composition) constitutes the insulating layer containing the resin composition.

Alternatively, if the metal foil-clad laminate is not used, the printed circuit board may be produced by forming a conductive layer corresponding to a circuit on a component made of the prepreg, the resin sheet or the resin composition. In this case, an electroless plating method can be employed for forming the conductive layer.

Since the insulating layer retains an excellent elastic modulus even at a reflow temperature employed in semiconductor packaging, so as to effectively suppress the warp of a semiconductor plastic package, the printed circuit board of the present embodiment can be particularly effectively used as a printed circuit board for a semiconductor package.

EXAMPLES

The present invention will now be described more specifically with reference to examples and comparative examples. It is noted that the present invention is not limited to the following examples at all.

Synthesis Example 1

Synthesis of Cyanate Ester Compound of Diallyl Bisphenol A (Hereinafter Abbreviated as DABPA-CN)

Seven hundred (700) g of diallyl bisphenol A (hydroxyl group equivalent: 154.2/eq.) (in terms of OH group: 4.54 mol) (DABPA, manufactured by Daiwa Fine Chemicals Co., Ltd.) and 459.4 (4.54 mol) (1.0 mol per mol of hydroxyl group) of triethylamine were dissolved in 2100 g of dichloromethane to obtain a solution 1.

The solution 1 was poured, over 90 minutes, into 474.4 g (7.72 mol) (1.7 mol per mol of hydroxyl group) of cyanogen chloride, 1106.9 g of dichloromethane, 735.6 g (7.26 mol) (1.6 mol per mol of hydroxyl group) of 36% hydrochloric acid, and 4560.7 g of water under stirring and while retaining the liquid temperature at −2 to −0.5° C. After completely pouring the solution 1, the resultant was stirred at the same temperature for 30 minutes, and a solution of 459.4 g (4.54 mol) (1.0 mol per mol of hydroxyl group) of triethylamine dissolved in 459.4 g of dichloromethane (a solution 2) was poured into the resultant over 25 minutes. After completely pouring the solution 2, the resultant was stirred at the same temperature for 30 minutes to complete the reaction.

Thereafter, the thus obtained reaction solution was allowed to stand still for separating an organic phase and an aqueous phase. The thus obtained organic phase was washed with 2 L of 0.1 N hydrochloric acid, and then with 2000 g of water six times. The waste water used in the sixth washing had an electrical conductivity of 20 µS/cm, and it was thus confirmed that ionic compounds removable by water washing could be sufficiently removed.

The organic phase having been washed with water was concentrated under a reduced pressure, and was finally concentrated to dryness at 90° C. for 1 hour to obtain 805 g of a cyanate ester compound DABPA-CN (in the form of a pale yellow liquid) of interest. An IR spectrum of the thus obtained cyanate ester compound DABPA-CN had an absorption at 2264 cm$^{-1}$ (derived from a cyanate ester group) and had no absorption derived from a hydroxyl group.

Synthesis Example 2

Synthesis of Naphthol Aralkyl-based Cyanate Ester Compound (SNCN)

Three hundred (300) g (in terms of OH group: 1.28 mol) of 1-naphthol aralkyl resin (manufactured by Nippon Steel & Sumikin Chemical Co., Ltd.) and 194.6 g (1.92 mol) (1.5 mol per mol of hydroxyl group) of triethylamine were dissolved in 1800 g of dichloromethane to obtain a solution 1.

On the other hand, 125.9 g (2.05 mol) (1.6 mol per mol of hydroxyl group) of cyanogen chloride, 293.8 g of dichloromethane, 194.5 g (1.92 mol) (1.5 mol per mol of hydroxyl group) of 36% hydrochloric acid, and 1205.9 g of water were mixed to obtain a solution 2. The solution 1 was poured, over 30 minutes, into the solution 2 under stirring and while retaining the liquid temperature at −2 to −0.5° C. After completely pouring the solution 1, the resultant was stirred at the same temperature for 30 minutes, and then, a solution of 65 g (0.64 mol) (0.5 mol per mol of hydroxyl group) of triethylamine dissolved in 65 g of dichloromethane (a solution 3) was poured into the solution 2 over 10 minutes. After completely pouring the solution 3, the resultant was stirred at the same temperature for 30 minutes to complete the reaction.

Thereafter, the thus obtained reaction solution was allowed to stand still for separating an organic phase and an aqueous phase. The thus obtained organic phase was washed with 1300 g of water five times. The waste water used in the fifth washing had an electrical conductivity of 5 µS/cm, and it was thus confirmed that ionic compounds removable by water washing could be sufficiently removed.

The organic phase having been washed with water was concentrated under a reduced pressure, and was finally concentrated to dryness at 90° C. for 1 hour to obtain 331 g of a naphthol aralkyl-based cyanate ester compound (SNCN) (in the form of an orange viscous substance) of interest. The thus obtained SNCN had a mass average molecular weight Mw of 600. An IR spectrum of the SNCN had an absorption at 2250 cm$^{-1}$ (derived from a cyanate ester group) and had no absorption derived from a hydroxyl group.

Example A1

Varnish was obtained by mixing 53.5 parts by mass of the cyanate ester compound of diallyl bisphenol A of Synthesis Example 1 (allyl equivalent: 179 g/eq.) (DABPA-CN), 46.5 parts by mass of a maleimide compound (B) (BMI-2300, manufactured by Daiwa Fine Chemicals Co., Ltd.) and 100 parts by mass of a silica (SC-4053SQ, manufactured by Admatechs Company Limited), and diluting the resultant mixture with methyl ethyl ketone. The thus obtained varnish was coated by impregnation on an E glass woven fabric, and the resultant was dried by heating at 160° C. for 3 minutes to obtain a prepreg containing the resin composition in a content of 46% by mass.

Example A2

A prepreg was obtained in the same manner as in Example A1 except that the use amount of the DABPA-CN was changed to 51.4 parts by mass, and that the use amount of the BMI-2300 was changed to 48.6 parts by mass.

Example A3

A prepreg was obtained in the same manner as in Example A1 except that the use amount of the DABPA-CN was changed to 59.1 parts by mass, and that the use amount of the BMI-2300 was changed to 40.9 parts by mass.

Example A4

A prepreg was obtained in the same manner as in Example A1 except that the use amount of the DABPA-CN was changed to 63.4 parts by mass, and that the use amount of the BMI-2300 was changed to 36.6 parts by mass.

Example A5

A prepreg was obtained in the same manner as in Example A1 except that the use amount of the DABPA-CN was changed to 54 parts by mass, that the use amount of the BMI-2300 was changed to 46 parts by mass, and that the silica (SC-4053SQ, manufactured by Admatechs Company Limited) was replaced by 100 parts by mass of alumina (Sumicorundum AA-03, manufactured by Sumitomo Chemical Co., Ltd.) and 130 parts by mass of hexagonal boron nitride (MBN-010T, manufactured by Mitsui Chemicals, Inc., average particle size: 1.0 μm).

Example A6

A prepreg was obtained in the same manner as in Example A1 except that the use amount of the DABPA-CN was changed to 33.8 parts by mass, that the use amount of the BMI-2300 was changed to 29.2 parts by mass, and that 37 parts by mass of diallyl bisphenol A-based epoxy (RE-810NM, manufactured by Nippon Kayaku Co., Ltd.) was further used.

Example A7

A prepreg was obtained in the same manner as in Example A6 except that the use amount of the DABPA-CN was changed to 32 parts by mass, that the use amount of the BMI-2300 was changed to 16 parts by mass, that 16 parts by mass of a maleimide compound (BMI-70, maleimide equivalent: 221 g/eq., manufactured by K•I Chemical Industry Co., Ltd.) and 36 parts by mass of diallyl bisphenol A-based epoxy (RE-810NM, manufactured by Nippon Kayaku Co., Ltd.) were further used, and that the silica (SC-4053SQ, manufactured by Admatechs Company Limited) was replaced by 100 parts by mass of alumina (Sumicorundum AA-03, manufactured by Sumitomo Chemical Co., Ltd.) and 130 parts by mass of hexagonal boron nitride (INN-010T, manufactured by Mitsui Chemicals, Inc., average particle size: 1.0 μm).

Example A8

A prepreg was obtained in the same manner as in Example A1 except that the use amount of the DABPA-CN was changed to 49 parts by mass, that the use amount of the BMI-2300 was changed to 36 parts by mass, that 15 parts by mass of diallyl bisphenol A-based epoxy (RE-810NM, manufactured by Nippon Kayaku Co., Ltd.) was further used, and that the silica (SC-4053SQ, manufactured by Admatechs Company Limited) was replaced by 100 parts by mass of alumina (Sumicorundum AA-03, manufactured by Sumitomo Chemical Co., Ltd.) and 130 parts by mass of hexagonal boron nitride (MBN-010T, manufactured by Mitsui Chemicals, Inc., average particle size: 1.0 μm).

Comparative Example A1

A prepreg was obtained in the same manner as in Example A1 except that the DABPA-CN was replaced by 50 parts by mass of bisphenol A-based cyanate (2,2-bis(4-cyanatophenyl)propane (TA, manufactured by Mitsubishi Gas Chemical Company, Inc.), and that the use amount of the BMI-2300 was changed to 50 parts by mass.

Comparative Example A2

A prepreg was obtained in the same manner as in Example A1 except that the DABPA-CN was replaced by 50 parts by mass of the naphthol aralkyl-based cyanate ester compound (SNCN) obtained in Synthesis Example 2, and that the use amount of the BMI-2300 was changed to 50 parts by mass.

[Production of Metal Foil-clad Laminate]

Electrolytic copper foils each having a thickness of 12 μm (3EC-VLP, manufactured by Mitsui Mining & Smelting Co., Ltd.) were respectively disposed on the upper and lower sides of one layer or eight layers of the prepreg obtained in each of Examples A1 to A8 and Comparative Examples A1 and A2, and the resultant was lamination-molded at a pressure of 30 kgf/cm$^2$ and a temperature of 220° C. for 120 minutes to obtain a copper-clad laminate including an insulating layer with a thickness of 0.1 mm or 0.8 mm. The thus obtained copper-clad laminate was evaluated as follows:

[Flexural Strength]

A piece of the copper-clad laminate with a size of 50 mm×25 mm×0.8 mm was used as a sample, and the flexural strength was measured at 25° C. using an autograph (AG-Xplus manufactured by Shimadzu Corp.) in accordance with JIS K6911.

[Flexural Modulus]

A piece of the copper-clad laminate with a size of 50 mm×25 mm×0.8 mm was used as a sample, and the flexural modulus was measured at 25° C. using an autograph (AG-Xplus manufactured by Shimadzu Corp.) in accordance with JIS C6481.

[Dielectric Constant]

The dielectric constant (Dk 10 GHz) was measured using HP8722ES manufactured by Agilent Technologies Inc. by a cavity perturbation method.

[Glass Transition Temperature (Tg)]

The copper-clad laminate including the insulating layer with a thickness of 0.8 mm obtained as described above was cut into a size of 12.7×2.5 mm with a dicing saw, and then, the copper foil disposed on the surface was removed by etching to obtain a measurement sample. The measurement sample was used for measuring a glass transition temperature by a DMA method using a dynamic viscoelasticity analyzer (manufactured by TA Instruments, Inc.) in accordance with JIS C6481 (as an average of n=3).

[Coefficient of Thermal Expansion]

A TMA (Thermo-mechanical analysis) method according to JIS C6481 was employed to measure a coefficient of thermal expansion in the vertical direction (warp) of the glass cloth of the laminate. Specifically, after removing the copper foils disposed on the both surfaces of each copper-clad laminate (50 mm×25 mm×0.8 mm) by etching, the temperature was increased from 40° C. to 340° C. at 10° C./min using a thermomechanical analyzer (manufactured by TA Instruments, Inc.), so as to measure a coefficient of linear thermal expansion (ppm/° C.) in the vertical direction in a temperature range from 60° C. to 120° C.

[Thermal Conductivity]

Each copper-clad laminate obtained as described above was measured for the density, for the specific heat using a DSC (manufactured by TA Instruments, Inc., Q100 model), and further for the thermal diffusivity using a xenon flash analyzer (manufactured by Bruker Corp., product name "LFA447 Nanoflash"). Then, the thermal conductivity in the thickness direction was calculated in accordance with the following formula:

Thermal conductivity (W/m·K)=Density (kg/m$^3$)× Specific heat (kJ/kg·K)×Thermal diffusivity (m$^2$/S)×1000

The results are shown in Table 1 below.

mixture with methyl ethyl ketone. Incidentally, a ratio of the number of maleimide groups ($\beta$) in the maleimide compound to the sum of the number of alkenyl groups ($\alpha$) in the alkenyl-substituted nadimide compound and the number of allyl groups ($\alpha'$) in the allyl group-containing compound (a ratio ($\beta/(\alpha+\alpha')$)) was 2.1.

The thus obtained varnish was coated by impregnation on an E glass woven fabric, and the resultant was dried by heating at 160° C. for 3 minutes to obtain a prepreg containing the resin composition in a content of 46% by mass.

Example B2

A prepreg was obtained in the same manner as in Example B1 except that the diallyl bisphenol A (DABPA, manufactured by Daiwa Fine Chemicals Co, Ltd.) was replaced by the cyanate ester compound of diallyl bisphenol A of Synthesis Example 1 (allyl equivalent: 179 g/eq.) (DABPA-CN). It was noted that the ratio ($\beta/(\alpha+\alpha')$) was 2.1.

Example B3

A prepreg was obtained in the same manner as in Example B1 except that the diallyl bisphenol A (DABPA, manufactured by Daiwa Fine Chemicals Co., Ltd.) was replaced by diallyl bisphenol A-based epoxy (allyl equivalent: 221 g/eq.) (DABPA-Ep, manufactured by Nippon Kayaku Co., Ltd.). It was noted that the ratio ($\beta/(\alpha+\alpha')$) was 2.2.

Comparative Example B1

A prepreg was obtained in the same manner as in Example B1 except that the diallyl bisphenol A (DABPA, manufac-

TABLE 1

| | | | Example | | | | | | | | Comparative Example | |
|---|---|---|---|---|---|---|---|---|---|---|---|---|
| | | | 1 | 2 | 3 | 4 | 5 | 6 | 7 | 8 | 1 | 2 |
| Flexural strength | 0.8 mmt | MPa | 709 | 671 | 679 | 652 | 652 | 681 | 672 | 676 | 512 | 506 |
| Flexural modulus | 0.8 mmt | GPa | 34.2 | 32.2 | 33.2 | 32.7 | 32.7 | 33.2 | 32.0 | 32.5 | 27.8 | 29.3 |
| Dielectric constant | 0.8 mmt | Dk (10 GHz) | 4.10 | 4.05 | 4.03 | 4.06 | 4.35 | 4.11 | 4.53 | 4.49 | 4.70 | 4.43 |
| Glass transition temperature | tan δ | ° C. | 349 | 347 | 336 | 333 | 327 | 338 | 326 | 325 | 291 | 294 |
| Coefficient of thermal expansion | 0.8 mmt | CTE-x α1 ppm/K | 4.6 | 4.7 | 5.4 | 5.0 | 8.7 | 8.7 | 9.5 | 8.9 | 9.8 | 10.6 |
| Thermal conductivity | Z-direction | W/m · K | 0.83 | 0.84 | 0.83 | 0.84 | 2.55 | 0.92 | 2.80 | 2.68 | 0.73 | 0.590 |

Example B1

Varnish was obtained by mixing 32 parts by mass of bisallyl nadimide represented by formula (4) (BANI-M, manufactured by Maruzen Petrochemical Co., Ltd. (allyl equivalent: 286 g/eq.)), 55 parts by mass of a maleimide compound represented by formula (6) wherein R5 all represent a hydrogen atom and n was 1 to 3 (BMI-2300, manufactured by Daiwa Fine Chemicals Co., Ltd.), 5 parts by mass of diallyl bisphenol A (allyl equivalent: 154 g/eq.) (DABPA, manufactured by Daiwa Fine Chemicals Co., Ltd.), 8 parts by mass of an epoxy resin (NC-3000H, manufactured by Nippon Kayaku Co., Ltd.), and 200 parts by mass of an inorganic filler (SC-4053SQ, manufactured by Admatechs Company Limited), and by diluting the resultant tured by Daiwa Fine Chemicals Co., Ltd.) was not used, that the use amount of the bisallyl nadimide (BANI-M, manufactured by Maruzen Petrochemical Co., Ltd.), was changed to 33 parts by mass, that the use amount of the maleimide compound (BMI-2300, manufactured by Daiwa Fine Chemicals Co., Ltd.) was changed to 58 parts by mass, and that the use amount of the epoxy resin (NC-3000H, manufactured by Nippon Kayaku Co., Ltd.) was changed to 9 parts by mass. It was noted that the ratio ($\beta/(\alpha+\alpha')$) was 2.7.

Example B4

Varnish was obtained by mixing 32 parts by mass of bisallyl nadimide (BANI-M, manufactured by Maruzen Petrochemical Co., Ltd.), 63 parts by mass of a maleimide compound (BMI-2300, manufactured by Daiwa Fine Chemicals Co., Ltd.), 5 parts by mass of diallyl bisphenol A (DABPA, manufactured by Daiwa Fine Chemicals Co., Ltd.) and 200 parts by mass of an inorganic filler (SC-4053SQ, manufactured by Admatechs Company Limited), and diluting the resultant mixture with methyl ethyl ketone. It was noted that the ratio ($\beta/(\alpha+\alpha')$) was 2.3.

The thus obtained varnish was coated by impregnation on an E glass woven fabric, and the resultant was dried by heating at 160° C. for 3 minutes to obtain a prepreg containing the resin composition in a content of 46% by mass.

Example B5

A prepreg was obtained in the same manner as in Example B4 except that the diallyl bisphenol A (DABPA, manufactured by Daiwa Fine Chemicals Co., Ltd.) was replaced by the cyanate ester compound of diallyl bisphenol A of Synthesis Example 1 (DABPA-CN), that the use amount of the bisallyl nadimide (BANI-M, manufactured by Maruzen Petrochemical Co., Ltd.) was changed to 32 parts by mass, and that the use amount of the maleimide compound (BMI-2300, manufactured by Daiwa Fine Chemicals Co., Ltd.) was changed to 63 parts by mass. It was noted that the ratio ($\beta/(\alpha+\alpha')$) was 2.4.

Example B6

A prepreg was obtained in the same manner as in Example B4 except that the diallyl bisphenol A (DABPA, manufactured by Daiwa Fine Chemicals Co., Ltd.) was replaced by diallyl bisphenol A-based epoxy (DABPA-Ep, manufactured by Nippon Kayaku Co., Ltd.), that the use amount of the bisallyl nadimide (BANI-M, manufactured by Maruzen Petrochemical Co., Ltd.) was changed to 32 parts by mass, and that the use amount of the maleimide compound (BMI-2300, manufactured by Daiwa Fine Chemicals Co., Ltd.) was changed to 63 parts by mass. It was noted that the ratio ($\beta/(\alpha+\alpha')$) was 2.5.

Comparative Example B2

A prepreg was obtained in the same manner as in Example B4 except that the diallyl bisphenol A (DABPA, manufactured by Daiwa Fine Chemicals Co., Ltd.) was not used, that the use amount of the bisallyl nadimide (BANI-M, manufactured by Maruzen Petrochemical Co., Ltd.) was changed to 33 parts by mass, and the use amount of the maleimide compound (BMI-2300, manufactured by Daiwa Fine Chemicals Co., Ltd.) was changed to 67 parts by mass. It was noted that the ratio ($\beta/(\alpha+\alpha')$) was 3.1.

[Production of Metal Foil-Clad Laminate]

Electrolytic copper foils each having a thickness of 12 μm (3EC-VLP, manufactured by Mitsui Mining & Smelting Co., Ltd.) were respectively disposed on the upper and lower sides of one layer or eight layers of the prepreg obtained in each of Examples B1 to B6 and Comparative Examples B1 and B2, and the resultant was lamination-molded at a pressure of 30 kgf/cm$^2$ and a temperature of 220° C. for 120 minutes to obtain a copper-clad laminate including an insulating layer with a thickness of 0.1 mm or 0.8 mm. The thus obtained copper-clad laminate was measured for the glass transition temperature (Tg), the coefficient of linear thermal expansion, and the copper foil peel strength as follows.

[Glass Transition Temperature (Tg)]

Each copper-clad laminate including the insulating, layer having a thickness of 0.8 mm obtained as described above was cut into a size of 12.7×2.5 mm with a dicing saw, and then, the copper foil disposed on the surface was removed by the etching to obtain a measurement sample. The measurement sample was used for measuring the glass transition temperature by the DMA method using a dynamic viscoelasticity analyzer (manufactured by TA Instruments, Inc.) in accordance with JIS C6481 (as an average of n=3).

[Coefficient of Thermal Expansion]

The TMA (Thermo-mechanical analysis) method according to JIS C6481 was employed to measure a coefficient of thermal expansion in the vertical direction (warp) of the glass cloth of the laminate. Specifically, after removing the copper foils disposed on the both surfaces of the copper-clad laminate (50 mm×25 mm×0.8 mm) by etching, the temperature was increased from 40° C. to 340° C. at 10° C./min using a thermomechanical analyzer (manufactured by TA Instruments, Inc.), so as to measure a coefficient of linear thermal expansion (ppm/° C.) in the vertical direction in a temperature range from 60° C. to 120° C.

[Copper Foil Peel Strength]

Each of the copper-clad laminates-(30 mm×150 mm×0.8 mm) was used for measuring the copper foil peel strength in accordance with JIS C6481.

TABLE 2

|  |  | Example B1 | Example B2 | Example B3 | Comparative Example B1 | Example B4 | Example B5 | Example B6 | Comparative Example B2 |
|---|---|---|---|---|---|---|---|---|---|
| Tg | ° C. | 360< | 360< | 360< | 310 | 360< | 360< | 360< | 300 |
| Coefficient of thermal expansion | ppm/° C. | 4.0 | 4.0 | 4.0 | 5.0 | 4.0 | 4.0 | 4.0 | 5.0 |
| Copper foil peel strength | kN/m | 1.0 | 1.0 | 1.0 | 0.9 | 0.9 | 0.9 | 0.9 | 0.8 |

The present application is based on Japanese patent application (Japanese Patent Application No. 2015-135209) filed with the Japan Patent Office on Jul. 6, 2015, and Japanese patent application (Japanese Patent Application No. 2016-092761) filed with the Japan Patent Office on May 2, 2016, the contents of which are incorporated herein by reference.

INDUSTRIAL APPLICABILITY

The resin composition of the present embodiment is industrially applicable as a prepreg, a resin sheet, a metal foil-clad laminate, or a material of a printed circuit board.

The invention claimed is:
1. A resin composition comprising:
an allyl group-containing compound (A); and
a maleimide compound (B), wherein the allyl group-containing compound (A) comprises a bisphenol compound in which a hydrogen element of an aromatic ring is substituted with an allyl group and a hydrogen element of an aromatic ring is substituted with a cyanate group, and/or a modified bisphenol compound in which a hydrogen element of an aromatic ring is substituted with an allyl group and a phenol-based hydroxyl group is substituted with a cyanate group.

2. The resin composition according to claim 1, wherein the allyl group-containing compound (A) comprises a compound represented by the following formula (7-1):

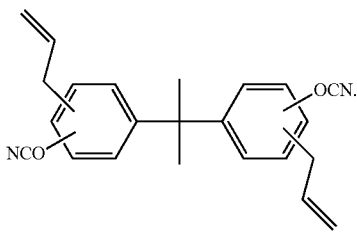

(7-1)

3. The resin composition according to claim 1, wherein the allyl group-containing compound (A) further comprises a compound represented by the following formula (7-2):

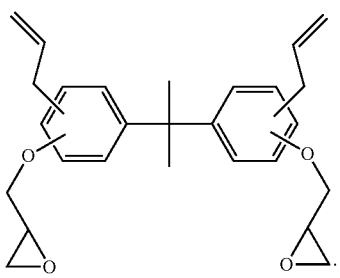

(7-2)

4. The resin composition according to claim 1, wherein a content of the allyl group-containing compound (A) is 1 to 90 parts by mass based on 100 parts by mass of a resin solid content.

5. The resin composition according to claim 1, further comprising a filler (C).

6. The resin composition according to claim 5, wherein a content of the filler (C) is 50 to 1600 parts by mass based on 100 parts by mass of a resin solid content.

7. The resin composition according to claim 5, wherein the filler (C) comprises at least one selected from the group consisting of silica, alumina, magnesium oxide, aluminum hydroxide, boehmite, boron nitride, agglomerated boron nitride, silicon nitride and aluminum nitride.

8. The resin composition according to claim 5, wherein the filler (C) is one, two or more selected from the group consisting of alumina, boron nitride, agglomerated boron nitride, silicon nitride, and aluminum nitride.

9. The resin composition according to claim 1, further comprising one, two or more selected from the group consisting of an allyl group-containing compound different from the allyl group-containing compound (A), a cyanate ester compound, an epoxy resin, a phenol resin, an oxetane resin, a benzoxazine compound, and a compound having a polymerizable unsaturated group.

10. A metal foil-clad laminate comprising:
at least one layer of a prepreg or a resin sheet; and
a metal foil disposed on one side or both sides of the prepreg or the resin sheet,
wherein the prepreg comprises a base material; and the resin composition according to claim 1 impregnated in or coated on the base material, and the resin sheet comprises a sheet base material; and the resin composition laminated on one side or both sides of the sheet base material.

11. A printed circuit board, comprising an insulating layer and a conductive layer formed on a surface of the insulating layer, wherein the insulating layer contains the resin composition according to claim 1.

12. The resin composition according to claim 1, wherein the bisphenol part of the bisphenol compound and/or the modified bisphenol compound is bisphenol A, bisphenol AP, bisphenol AF, bisphenol B, bisphenol BP, bisphenol C, bisphenol C, bisphenol E, bisphenol F, bisphenol G, bisphenol M, bisphenol S, bisphenol P, bisphenol PH, bisphenol TMC, or bisphenol Z.

13. A resin composition comprising:
an allyl group-containing compound (A);
a maleimide compound (B); and
an alkenyl-substituted nadimide compound (D),
wherein the allyl group-containing compound (A) comprises a bisphenol compound in which a hydrogen element of an aromatic ring is substituted with an allyl group and a hydrogen element of an aromatic ring is substituted with a cyanate group, and/or a modified bisphenol compound in which a hydrogen element of an aromatic ring is substituted with an allyl group and a phenol-based hydroxyl group is substituted with a cyanate group.

14. The resin composition according to claim 13, further comprising an epoxy resin.

15. The resin composition according to claim 14, wherein a content of the epoxy resin is 2.5 to 30 parts by mass based on 100 parts by mass of a resin solid content.

16. The resin composition according to claim 13, wherein the alkenyl-substituted nadimide compound (D) comprises a compound represented by the following formula (1):

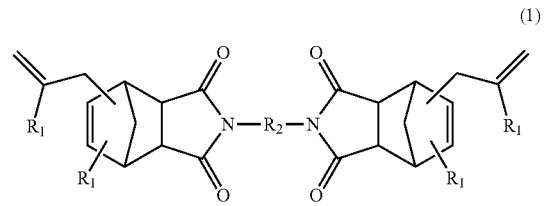

(1)

wherein each $R_1$ independently represents a hydrogen atom or an alkyl group having 1 to 6 carbon atoms, $R_2$ represents an alkylene group having 1 to 6 carbon atoms, a phenylene group, a biphenylene group, a naphthylene group, or a group represented by the following formula (2) or (3):

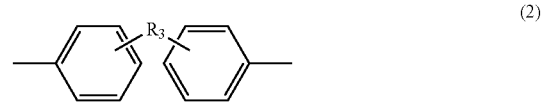

(2)

wherein R₃ represents a methylene group, an isopropylidene group, or a substituent represented by CO, O, S or SO₂, and

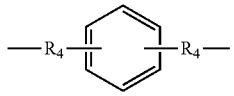
(3)

wherein each R₄ independently represents an alkylene group having 1 to 4 carbon atoms, or a cycloalkylene group having 5 to 8 carbon atoms.

17. The resin composition according to claim 13, wherein the alkenyl-substituted nadimide compound (D) comprises a compound represented by the following formula (4) and/or (5):

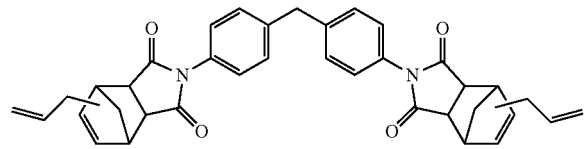
(4)

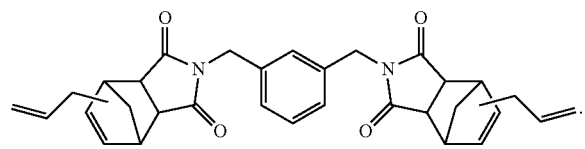
(5)

18. The resin composition according to claim 13, wherein the maleimide compound (B) comprises at least one selected from the group consisting of bis(4-maleimidephenyl)methane, 2,2-bis{4-(4-maleimidephenoxy)-phenyl}propane, bis(3-ethyl-5-methyl-4-maleimidephenyl)methane, and a maleimide compound represented by the following formula (6):

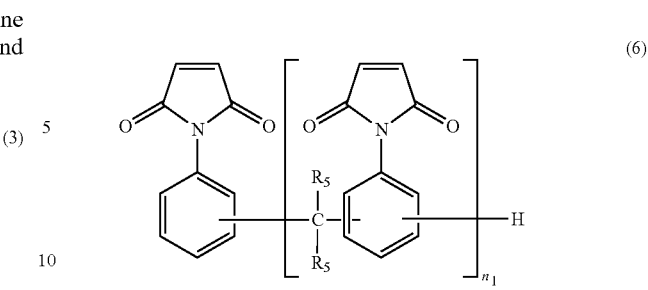
(6)

wherein each R₅ independently represents a hydrogen atom or a methyl group, and $n_1$ represents an integer of 1 or more.

19. The resin composition according to claim 13, wherein the allyl group-containing compound comprises a compound represented by the following formula (7):

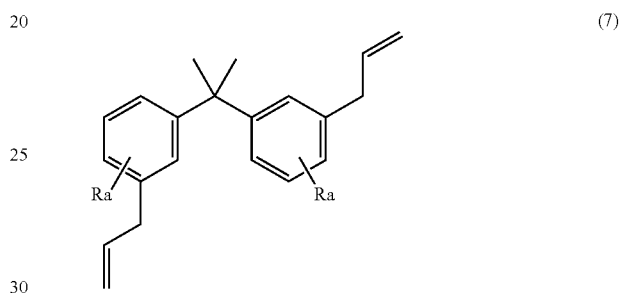
(7)

wherein each Ra independently represents the reactive functional group other than an allyl group.

20. The resin composition according to claim 13, further comprising a filler (C).

21. The resin composition according to claim 20, wherein the filler (C) comprises boehmite and/or a silica.

22. The resin composition according to claim 20, wherein a content of the filler (C) is 80 to 300 parts by mass based on 100 parts by mass of a resin solid content.

23. The resin composition according to claim 13, wherein a content of the alkenyl-substituted nadimide compound (D) is 25 to 90 parts by mass based on 100 parts by mass of a resin solid content.

24. The resin composition according to claim 13, wherein a content of the maleimide compound (B) is 35 to 65 parts by mass based on 100 parts by mass of a resin solid content.

25. The resin composition according to claim 13, wherein a content of the allyl group-containing compound (A) is 1.0 to 15 parts by mass based on 100 parts by mass of a resin solid content.

* * * * *